United States Patent
Liu et al.

(10) Patent No.: US 10,637,415 B1
(45) Date of Patent: Apr. 28, 2020

(54) LINEARITY IMPROVING SYSTEM AND LINEARITY IMPROVING METHOD

(71) Applicant: INDUSTRIAL TECHNOLOGY RESEARCH INSTITUTE, Hsinchu (TW)

(72) Inventors: Yu-Cheng Liu, Hualien (TW); Chih-Chun Shen, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/231,751

(22) Filed: Dec. 24, 2018

(30) Foreign Application Priority Data

Nov. 16, 2018 (TW) .............................. 107140923 A

(51) Int. Cl.
*H03F 3/24* (2006.01)
*H03F 1/32* (2006.01)

(52) U.S. Cl.
CPC ............ *H03F 3/24* (2013.01); *H03F 1/3211* (2013.01); *H03F 1/3241* (2013.01); *H03F 1/3282* (2013.01); *H03F 2200/451* (2013.01)

(58) Field of Classification Search
CPC ........ H03F 1/32; H03F 1/3211; H03F 1/3241; H03F 1/3282; H03F 1/3288; H03F 3/20; H03F 3/24; H03F 3/45; H03F 3/22; H03F 3/06; H03F 3/12; H03F 3/165; H03F 3/192; H03F 3/21; H03F 3/211; H03F 3/225; H03F 3/372; H03F 3/451; H04L 27/34; H04L 27/36; H04L 27/368
USPC ............... 375/258, 296, 297, 299, 302, 308, 375/318–320, 332, 329; 329/304, 345, 329/347, 349, 351; 330/127, 131, 135, 330/149; 455/114.2, 114.3, 338, 340, 341
See application file for complete search history.

(56) References Cited

U.S. PATENT DOCUMENTS

| 6,078,216 A | 6/2000 | Proctor, Jr. |
| 6,130,579 A | 10/2000 | Iyer et al. |
| 7,319,849 B2 | 1/2008 | Womac |

(Continued)

FOREIGN PATENT DOCUMENTS

| CN | 105324941 A | 2/2016 |
| CN | 107579716 A | 1/2018 |

(Continued)

OTHER PUBLICATIONS

Taiwanese Office Action and Search Report dated Jan. 8, 2019 for Application No. 107140923.

(Continued)

*Primary Examiner* — Young T Tse
(74) *Attorney, Agent, or Firm* — Birch, Stewart, Kolasch & Birch, LLP

(57) ABSTRACT

A linearity improving system and a linearity improving method are provided. The linearity improving system includes a coupler, a downconverter and a transformer. The coupler is configured to couple a part of an input RF signal. The downconverter coupled to the coupler converts the input RF signal to a fundamental frequency and outputs a modulation signal. The transformer coupled to the downconverter adjusts a phase and a power of the modulation signal. After the input RF signal and the modulation signal being adjusted are inputted to an amplifier, the amplifier outputs an output RF signal.

6 Claims, 10 Drawing Sheets

(56) References Cited

U.S. PATENT DOCUMENTS

| | | | |
|---|---|---|---|
| 7,403,573 B2 | 7/2008 | Debruyn et al. | |
| 7,414,475 B2 | 8/2008 | Kim | |
| 7,567,123 B2 | 7/2009 | Leung et al. | |
| 9,660,600 B2 | 5/2017 | Whittaker | |
| 9,923,570 B2 | 3/2018 | Kris et al. | |
| 9,929,702 B2 | 3/2018 | Ma et al. | |
| 2007/0153937 A1* | 7/2007 | Itkin | H03G 3/3042 375/297 |
| 2009/0085658 A1* | 4/2009 | Liu | H03F 1/3247 330/149 |
| 2009/0282441 A1* | 11/2009 | Zipper | H04H 20/02 725/62 |
| 2011/0234315 A1 | 9/2011 | Chen et al. | |
| 2012/0106600 A1* | 5/2012 | Yu | H03F 1/3241 375/219 |
| 2014/0232468 A1 | 8/2014 | Hulbert | |
| 2015/0171815 A1* | 6/2015 | Maxim | H03G 3/3042 455/127.2 |
| 2016/0099686 A1* | 4/2016 | Perreault | H03G 3/004 330/296 |
| 2016/0277045 A1 | 9/2016 | Langer | |

FOREIGN PATENT DOCUMENTS

| | | |
|---|---|---|
| KR | 10-1214589 B1 | 12/2012 |
| TW | 200733654 A | 9/2007 |
| TW | 200901618 | 1/2009 |
| TW | 200929886 A | 7/2009 |
| TW | 201308882 A | 2/2013 |
| TW | 201509086 A | 3/2015 |
| TW | 201644189 A | 12/2016 |
| TW | 201815057 A | 4/2018 |

OTHER PUBLICATIONS

A Complete Evaluation System for the NS-WBLEP 100-## Family of Products, Evaluation Platforms | NanoSemi, Inc., Dec. 4, 2018, Total 2 pages. http://nanosemitech.com/evaluation-platform/.

Choi et al., "Synthesis of Reflection Type Negative Group Delay Circuit Using Transmission Line Resonator", Proceedings of the 39th European Microwave Conference, Sep. 29-Oct. 1, 2009, Rome Italy, pp. 902-905.

Fahimi et al., "IBM3 Injection Technique for Improving the Linearity of an RF Power Amplifier", ICEE 2015, pp. 1112-1117.

Khan et al., "Digital Predistortion for Joint Mitigation of I/Q Imbalance and MIMO Power Amplifier Distortion", IEEE Transactions on Microwave Theory and Techniques, Jan. 2017, vol. 65, No. 1, pp. 322-333.

Leung et al., "Analysis of Envelope Signal Injection for Improvement of RF Amplifier Intermodulation Distortion", IEEE Journal of Solid-State Circuits, Sep. 2005, vol. 40, No. 9, pp. 1888-1894.

Ravelo, "First-order low-pass negative group delay passive topology", Electronics Letters, Jan. 21, 2016, vol. 52, No. 2, pp. 124-126.

Ravelo, "High-Pass Negative Group Delay RC-Network Impedance", IEEE Transactions on Circuits and Systems—II: Express Briefs, Sep. 2017, vol. 64, No. 9, pp. 1052-1056.

RFPA2002, RF Micro Devices, Inc., 2015, pp. 1-12. http://www.rfmd.com/www.qorvo.com.

* cited by examiner

LINEARITY IMPROVING SYSTEM AND LINEARITY IMPROVING METHOD

This application claims the benefit of Taiwan application Serial No. 107140923, filed Nov. 16, 2018, the disclosure of which is incorporated by reference herein in its entirety.

TECHNICAL FIELD

This disclosure relates to a linearity improving system and a linearity improving method.

BACKGROUND

In response to the advent of the fifth generation of cellular mobile communications (5G communications) and in order to achieve the higher transmission data quantity, the frequency width of a modulation signal must be further increased from 20 MHz of LTE to a wider transmission bandwidth higher or equal to 100 MHz. In general, when the output power of the power amplifier increases, the degree of signal distortion becomes serious although the transmission efficiency is effectively increased. The power amplifier of the base transceiver station requires the very low degree of signal distortion, and usually uses the power back-off technology to achieve this target. However, the efficiency of the power amplifier is not good at this time.

Linearity can reflect the degree of signal distortion. If the linearity can be improved more effectively, then the greater output power and efficiency can be obtained. More particularly, in response to the advent of the 5G communications, the new technology for improving the broadband linearity further needs to be developed.

SUMMARY

This disclosure is directed to a linearity improving system and a linearity improving method, which use a modulation signal injection mechanism, so that the linearity of an amplifier can be improved when broadband signals are transmitted.

According to one embodiment of this disclosure, a linearity improving system is provided. The linearity improving system includes a coupler, a downconverter and a transformer. The coupler is configured to couple a part of an input RF signal. The downconverter is coupled to the coupler. The downconverter converts the input RF signal to a fundamental frequency and outputs a modulation signal. The transformer is coupled to the downconverter. The transformer is used to adjust a phase and a power of the modulation signal. After the input RF signal and the modulation signal being adjusted are inputted to an amplifier, the amplifier outputs an output RF signal.

According to another embodiment of this disclosure, a linearity improving method is provided. The linearity improving method includes the following steps. A part of an input RF signal is coupled, the input RF signal is converted to a fundamental frequency and a modulation signal is outputted. A phase and a power of the modulation signal are adjusted. After the input RF signal and the modulation signal being adjusted are inputted to an amplifier, an output RF signal is outputted.

The above and other aspects of this disclosure will become better understood with regard to the following detailed description of the preferred but non-limiting embodiments. The following description is made with reference to the accompanying drawings.

Figure 1:
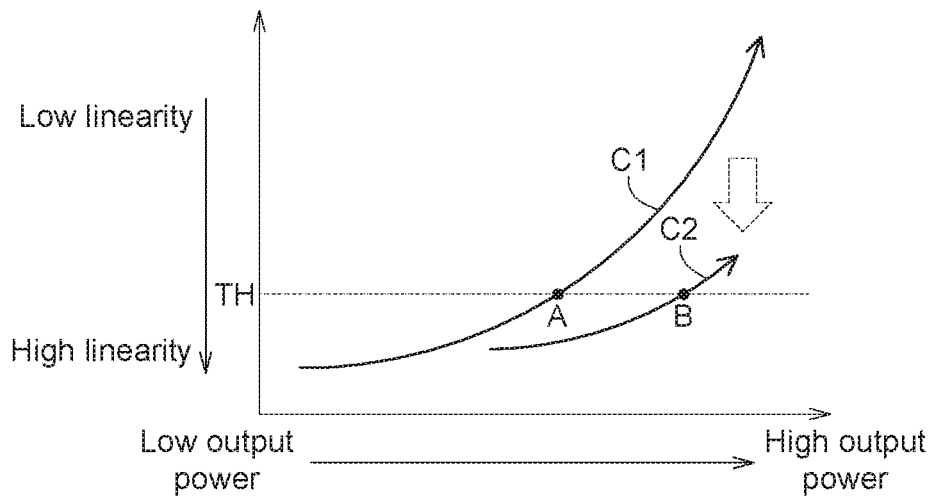
FIG. 1 is a schematic view showing improvement conditions of a linearity curve.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

This disclosure provides various embodiments to improve the linearity of a power amplifier. FIG. 1 is a schematic view showing improvement conditions of a linearity curve. According to a linearity curve C1 shown in FIG. 1, the linearity is negatively correlated with the output power, and the linearity gets lower as the output power gets higher. Therefore, under the linearity specification TH, the linearity curve C1 preferably only reaches the output power of a point A. After the improvement of the disclosure, the deteriorating situation of the linearity of a linearity curve C2 can be effectively improved. Therefore, under the linearity specification TH, the linearity curve C2 can preferably reach the output power of a point B.

Figure 2:
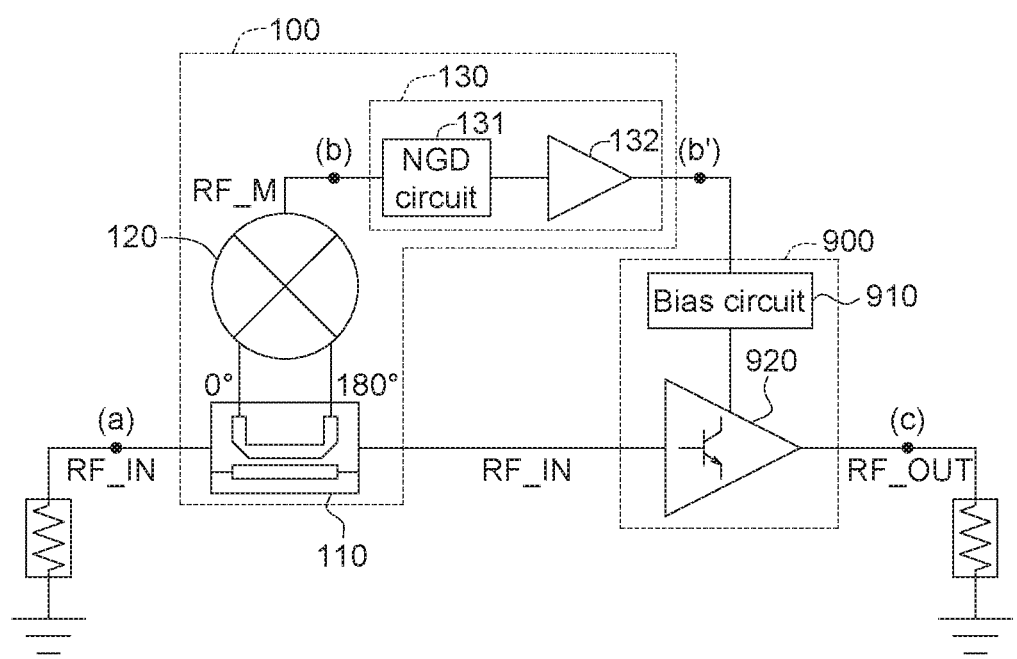
FIG. 2 is a schematic view showing a linearity improving system according to an embodiment.

FIG. 2 is a schematic view showing a linearity improving system 100 according to an embodiment. Referring to FIG. 2, the linearity improving system 100 includes a coupler 110, a downconverter 120 and a transformer 130. The coupler 110 is coupled to an input radio frequency (RF) signal RF_IN. The downconverter 120 is coupled to the coupler 110. The transformer 130 is coupled to the downconverter 120. An amplifier 900 is coupled to the transformer 130 and the coupler 110, and outputs an output RF signal RF_OUT. Operations of various elements will be described with reference to a flow chart.

Figure 3:
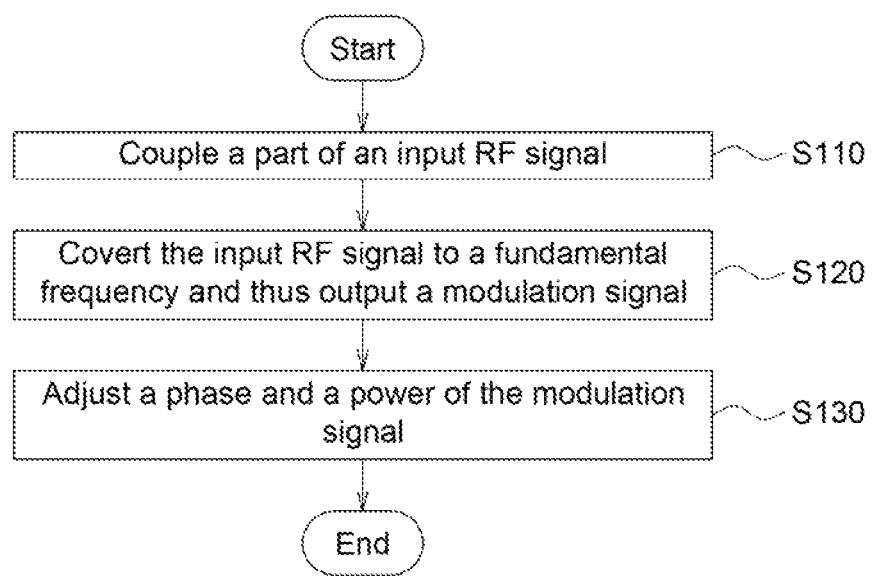
FIG. 3 is a flow chart showing a linearity improving method according to an embodiment.

Please refer to FIG. 3. FIG. 3 is a flow chart showing a linearity improving method according to an embodiment. Firstly, in a step S110, the coupler 110 is configured to couple a part of the input RF signal RF_IN. In this embodiment, the coupler 110 is used to provide a 0-degree phase signal and a 180-degree phase signal.

Next, in a step S120, the downconverter 120 converts the input RF signal RF_IN to a fundamental frequency and outputs a modulation signal RF_M. In this embodiment, the adopted coupler 110 and the downconverter 120 can reduce the loss of broadband modulation signal, and are different from a general power detector.

Then, in a step S130, the transformer 130 adjusts a phase and a power of the modulation signal RF_M. After the input RF signal RF_IN and the modulation signal RF_M being adjusted are inputted to the amplifier 900, the amplifier 900 outputs the above-mentioned output RF signal RF_OUT. In this embodiment, the transformer 130 includes a negative group delay circuit (NGD) 131 and a baseband amplifier 132. The negative group delay circuit 131 is used to adjust the phase of the modulation signal RF_M. The baseband amplifier 132 is used to adjust the power of the modulation signal RF_M. In this embodiment, the downconverter 120, negative group delay circuit 131 and the baseband amplifier 132 are coupled in order, wherein the phase adjustment is performed firstly, and then the power adjustment is performed. In another embodiment, the downconverter 120, the baseband amplifier 132 and the negative group delay circuit 131 may be coupled in order, wherein the power adjustment is performed firstly, and then the phase adjustment is performed.

The amplifier 900 includes a bias circuit 910 and an amplifier 920. After the input RF signal RF_IN and the modulation signal RF_M are inputted to the amplifier 900, the linearity of the output RF signal RF_OUT can be effectively improved.

Figure 4A:
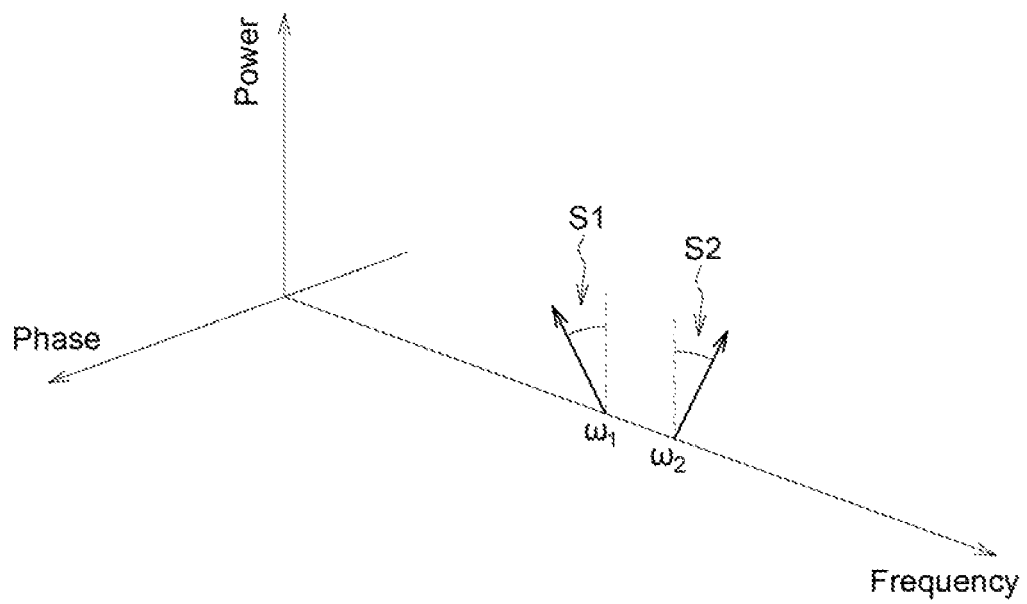
FIGS. 4A to 4C illustrate processes of signal modulation.
Figure 4B:
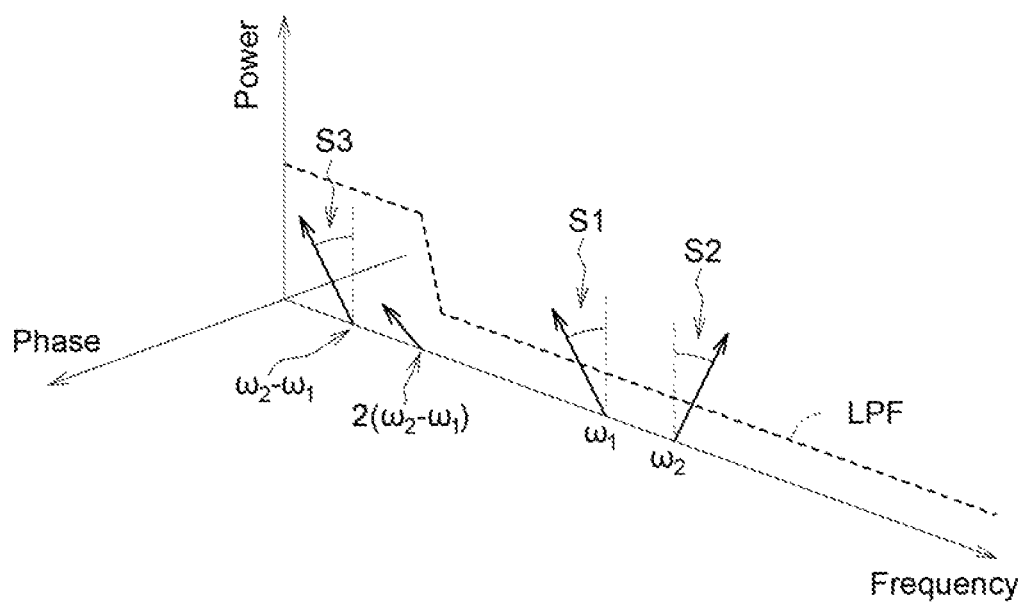
Figure 4C:
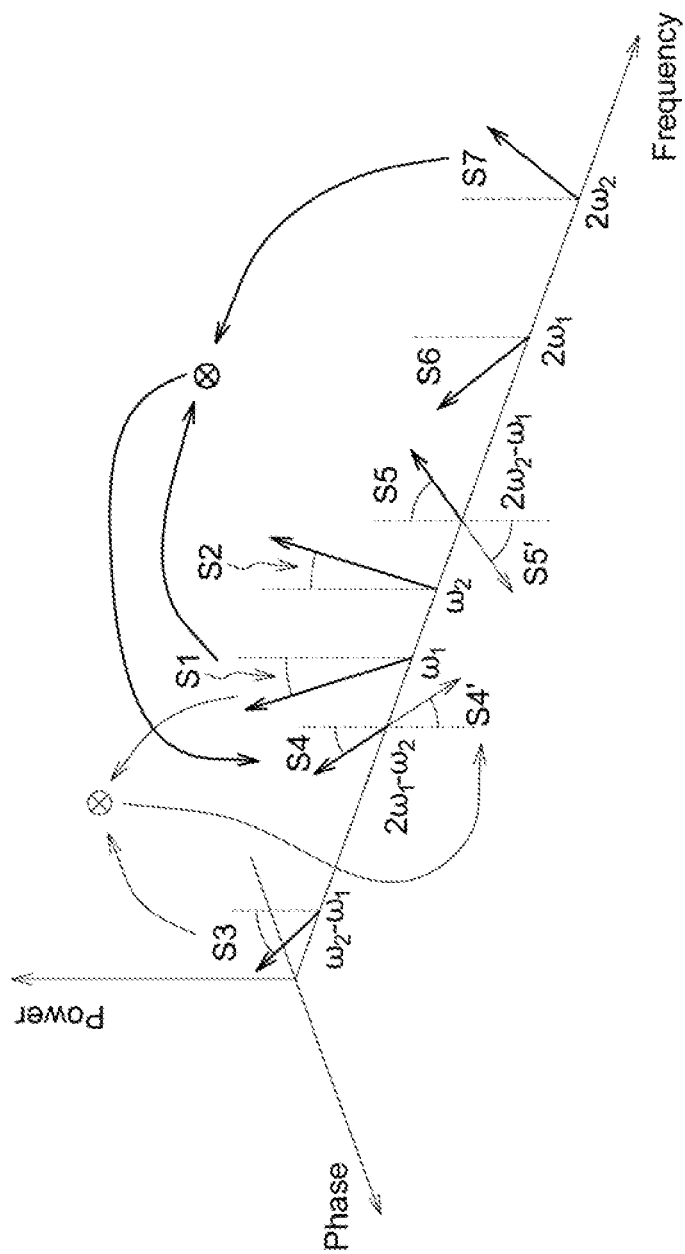

Please refer to FIGS. 4A to 4C, which illustrate the processes of signal modulation. When signals S1 and S2 with mixed dual-frequency of FIG. 4A are inputted to a node (a) of FIG. 2, the coupler 110 is used to couple small amounts of the signals S1 and S2 to the downconverter 120, and the downconverter 120 converts the signals S1 and S2 to the fundamental frequency. At this time, the results shown in FIG. 4B (i.e., the signals S1, S2 and S3) may be generated at a node (b) in FIG. 2. Next, the signals S1, S2 and S3 are injected into the bias circuit 910 of the amplifier 900 from a node (b') of FIG. 2 through the negative group delay circuit 131 and the baseband amplifier 132. Through the designs of the negative group delay circuit 131 and the baseband amplifier 132, the suitable phase and power may be adjusted. The amplifier 900 has the nonlinear property, and interactively modulates with the signal S1 having a frequency $\omega_1$ and the signal S2 having a frequency $\omega_2$ at an output terminal, and a signal S4' having a frequency of $(2\omega_1-\omega_2)$ and a signal S5' having a frequency of $(2\omega_2-\omega_1)$ are generated at a node (c) in FIG. 2 to suppress a signal S4 having a frequency of $(2\omega_1-\omega_2)$ and a signal S5 having a frequency of $(2\omega_2-\omega_1)$. Consequently, the signals S1 and S2 cannot be interfered by the signals S4 and S5, and the linearity can be effectively improved.

Figure 9:
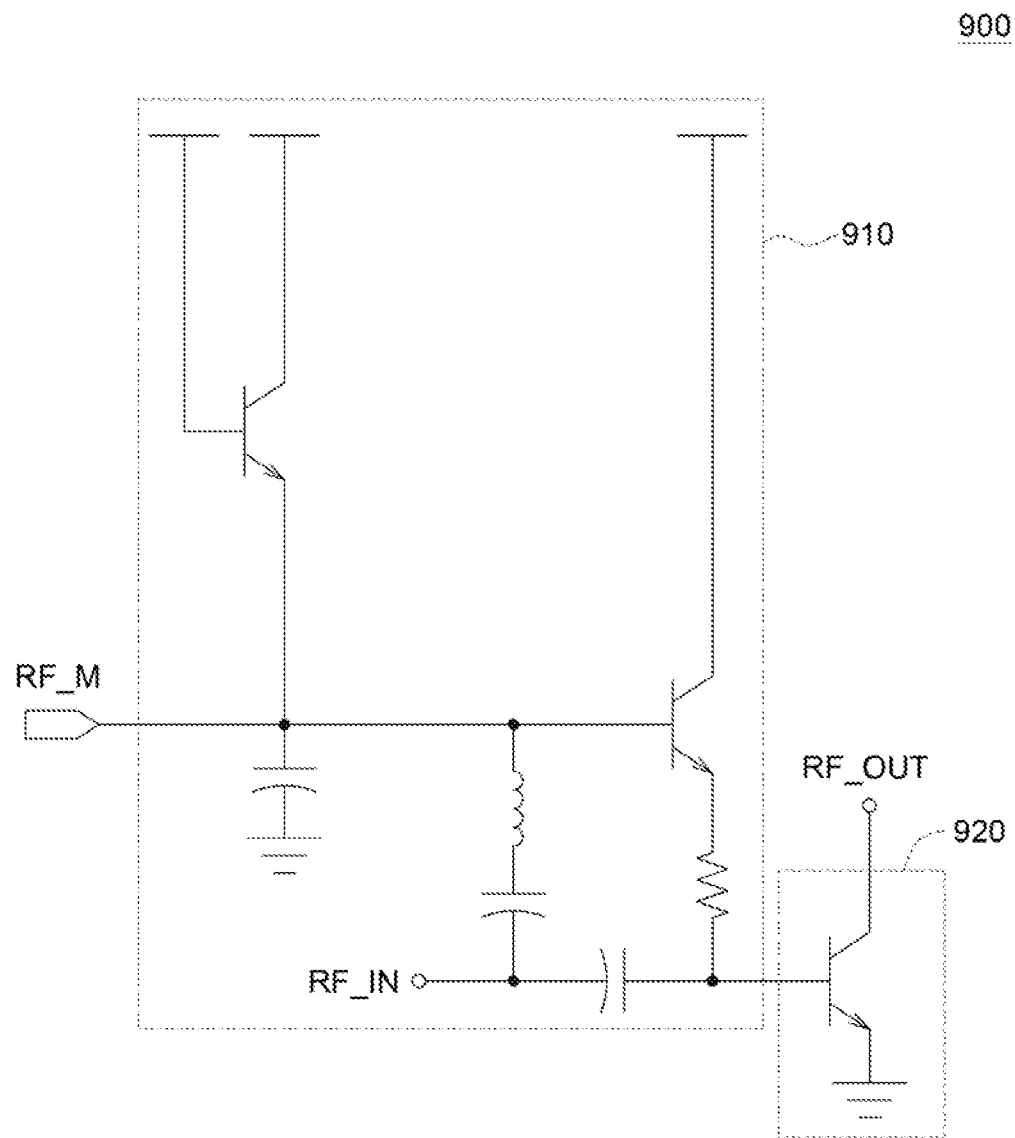
FIG. 9 is a schematic view showing an amplifier.

Referring to FIG. 2 and FIG. 9. The signals S1, S2 and S3 of FIG. 4B in point (b') of FIG. 2 are inputted into the bias circuit 910 of FIG. 9, wherein the signal S3 and the same signal with negative frequency term of FIG. 4B will generate the two signals S4' and S5' by using the non-linear characteristic of the amplifier of 920 in FIG. 9. The size and phase of two signals S4' and S5' can be achieved by adjusting the transformer 130 in FIG. 2.

Therefore, with the linearity improving system 100 and the linearity improving method of the above-mentioned embodiment, the linearity of the power amplifier 900 can be improved when the broadband signals are transmitted.

The above-mentioned embodiment uses the analog circuit architecture. Compared with the digital distortion phenomenon, the above-mentioned embodiment can reduce the DC power consumption and has the low cost for implementation.

In addition, when the mixed dual-frequency signals are transmitted in the above-mentioned embodiment, the third-order harmonic wave distortion thereof can be effectively improved. More particularly, when the broadband signals (such as 40, 100 MHz LTE) are transmitted, a neighboring channel leakage power (ACLR) thereof can be effectively suppressed.

Figure 5:
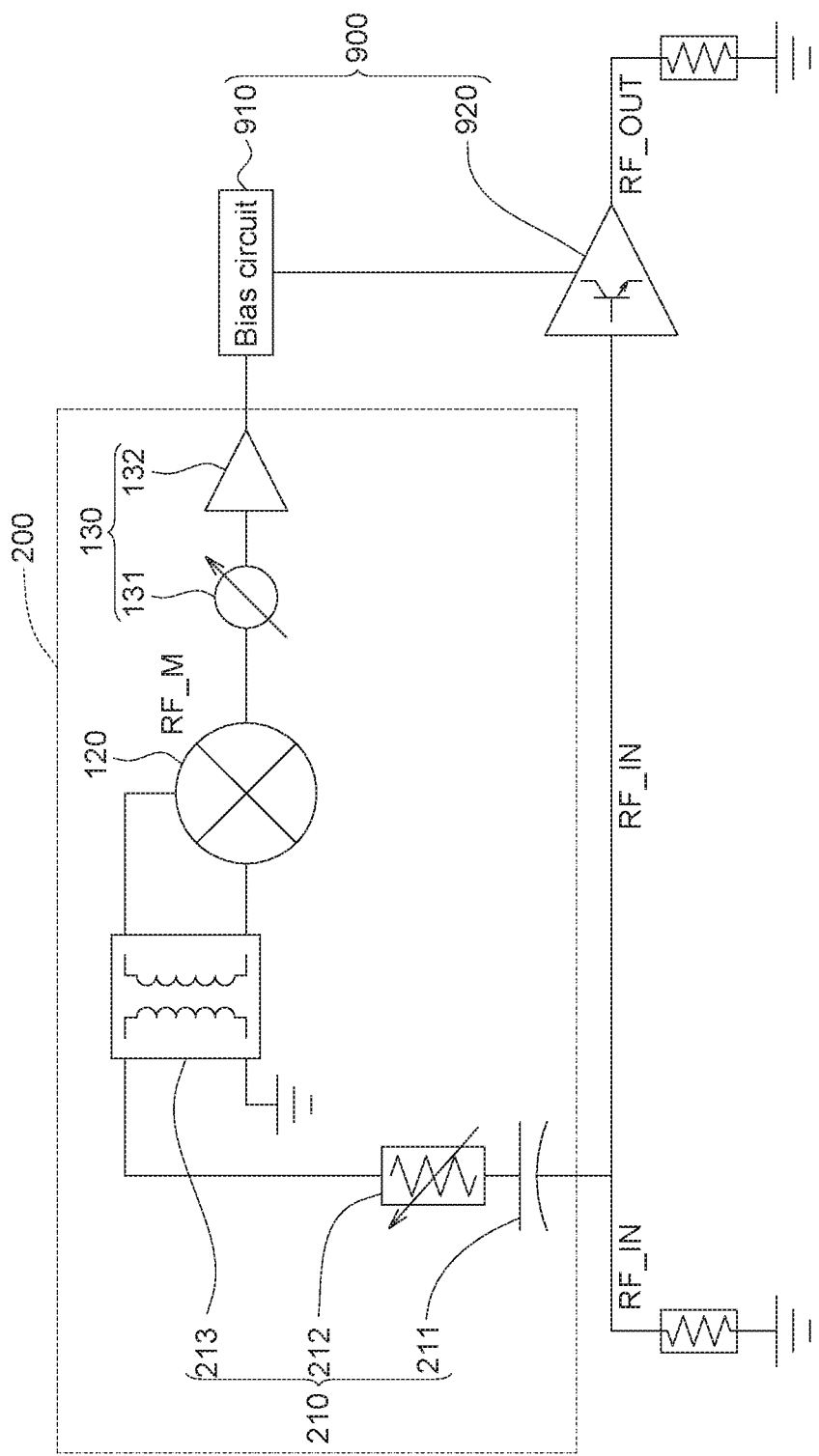
FIG. 5 is a schematic view showing a linearity improving system according to another embodiment.

FIG. 5 is a schematic view showing a linearity improving system 200 according to another embodiment. Referring to FIG. 5, a coupler 210 of the linearity improving system 200 in this embodiment includes an electrolyte capacitor 211, a tunable attenuator 212 and a balun 213. The electrolyte capacitor 211 receives the input RF signal RF_IN. The tunable attenuator 212 is coupled to the electrolyte capacitor 211. The balun 213 is coupled to the tunable attenuator 212. The coupler 210 described in the embodiment of FIG. 5 is only one of implementation methods of this disclosure, and does not intend to limit the scope of this disclosure.

Figure 6:
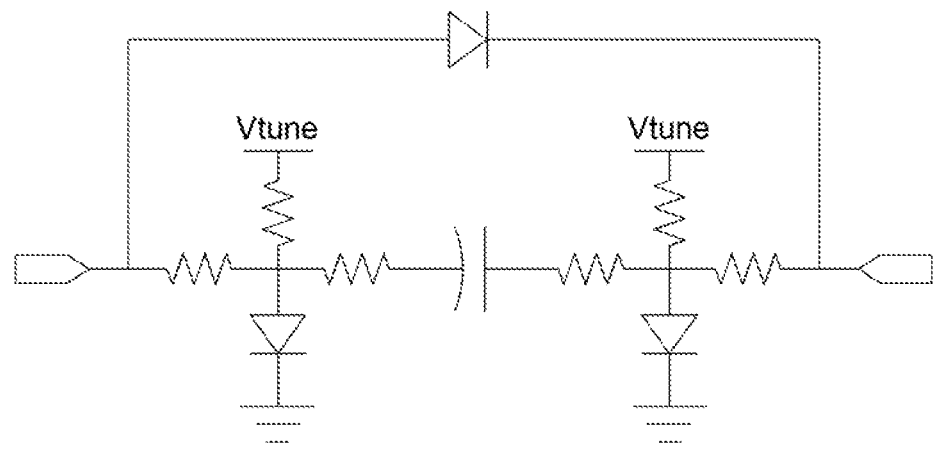
FIG. 6 is a schematic view showing a tunable attenuator according to an embodiment.

In more detail, please refer to FIG. 6. FIG. 6 is a schematic view showing the tunable attenuator 212 according to an embodiment. The tunable attenuator 212 consists of several resistors, diodes and capacitors, for example. The function of adjusting an amplitude of a signal can be implemented by adjusting a tunable voltage Vtune. However, the tunable attenuator 212 of FIG. 6 is only one of implementation methods of this disclosure, and does not intend to limit the scope of this disclosure.

The balun 213 is also referred as a single-ended to differential balancing circuit, and consists of two sets of ninety-degree couplers, for example.

Figure 7:
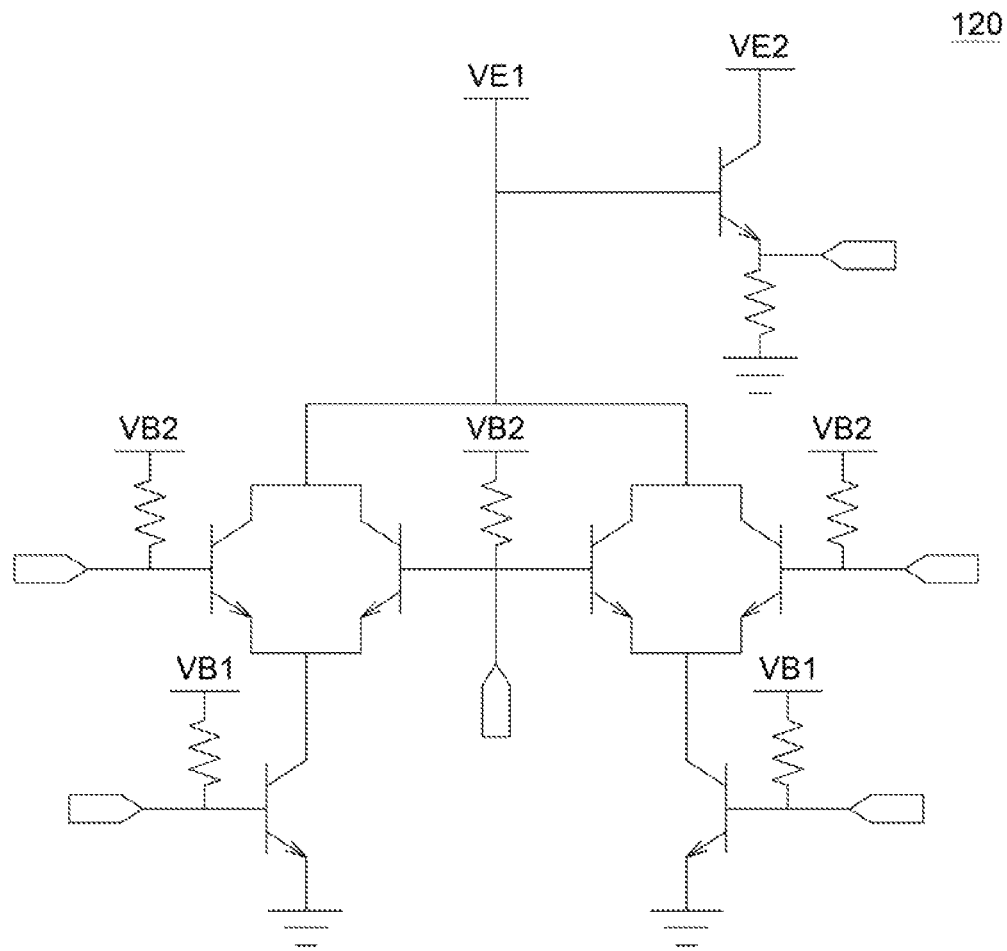
FIG. 7 is a schematic view showing a downconverter according to an embodiment.

FIG. 7 is a schematic view showing the downconverter 120 according to an embodiment. Referring to FIG. 7, the downconverter 120 consists of several transistors and resistors, for example. The downconverter 120 is also referred as a down-sampling converter or a frequency reduction circuit. The downconverter 120 implements the function of converting the signal to the fundamental frequency by the inputs of the voltages VE1, VE2, VB1 and VB2. However, the downconverter 120 of FIG. 7 is only one of implementation methods of this disclosure, and does not intend to limit the scope of this disclosure.

Figure 8A:
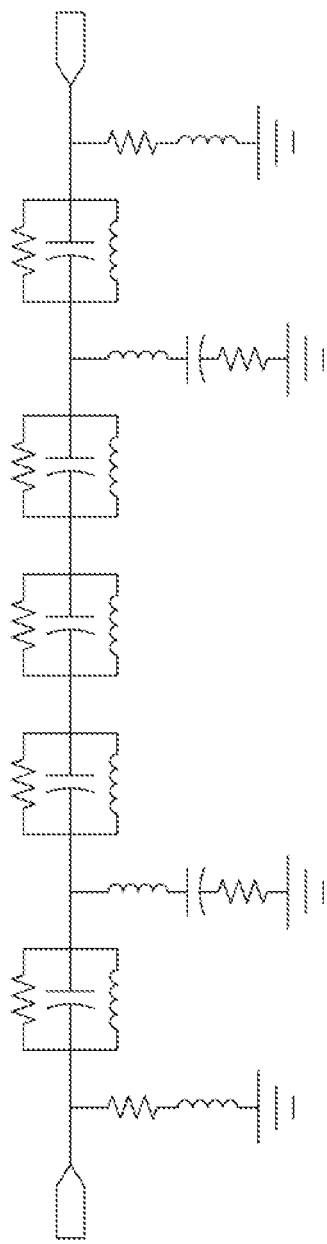
FIG. 8A is a schematic view showing a negative group delay circuit according to an embodiment.

FIG. 8A is a schematic view showing the negative group delay circuit 131 according to an embodiment. Referring to FIG. 8A, the negative group delay circuit 131 consists of several resistors, inductors and capacitors, for example. For example, the negative group delay circuit 131 is in the form of a filter for the purpose of generating a signal having the phase opposite the phase of a power signal of a neighboring channel. Through the appropriate circuit design, the negative group delay circuit 131 makes the relationship between the phase and the frequency become positively correlated in a certain specific frequency range. However, the negative group delay circuit 131 of FIG. 8A is only one of implementation methods of this disclosure, and does not intend to limit the scope of this disclosure.

Figure 8B:
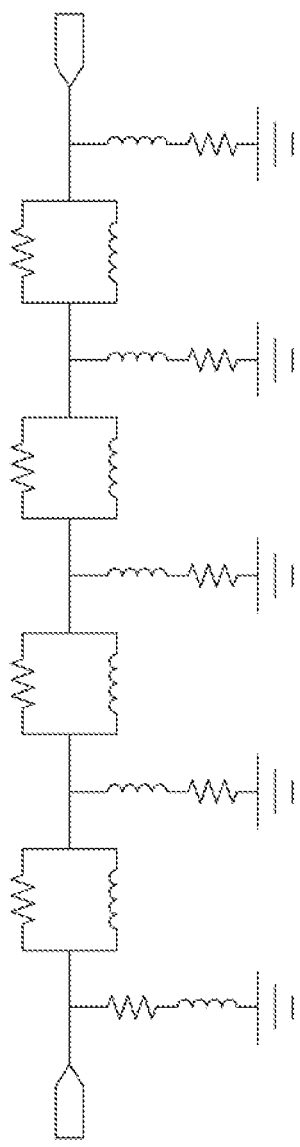
FIG. 8B is a schematic view showing a negative group delay circuit according to an embodiment.

FIG. 8B is a schematic view showing a negative group delay circuit 131' according to an embodiment. Referring to FIG. 8B, the negative group delay circuit 131' consists of several resistors and inductors, for example. Through the appropriate circuit design, the relationship between the phase and the frequency can be positively correlated in a certain specific frequency range. However, the negative group delay circuit 131' of FIG. 8B is only one of implementation methods of this disclosure, and does not intend to limit the scope of this disclosure.

The objective of the baseband amplifier 132 is to generate a signal having the amplitude the same as that of the power signal of the neighboring channel.

FIG. 9 is a schematic view showing the amplifier 900. Referring to FIG. 9, the bias circuit 910 and the amplifier 920 of the amplifier 900 consist of several transistors, diodes, inductors, capacitors and resistors, for example. After the input RF signal RF_IN is inputted to the amplifier 900, the input RF signal RF_IN is amplified into the output RF signal RF_OUT through the assistance of the modulation signal RF_M inputted to the bias circuit 910. Consequently, the linearity of the output RF signal RF_OUT can be effectively improved.

Figure 10:
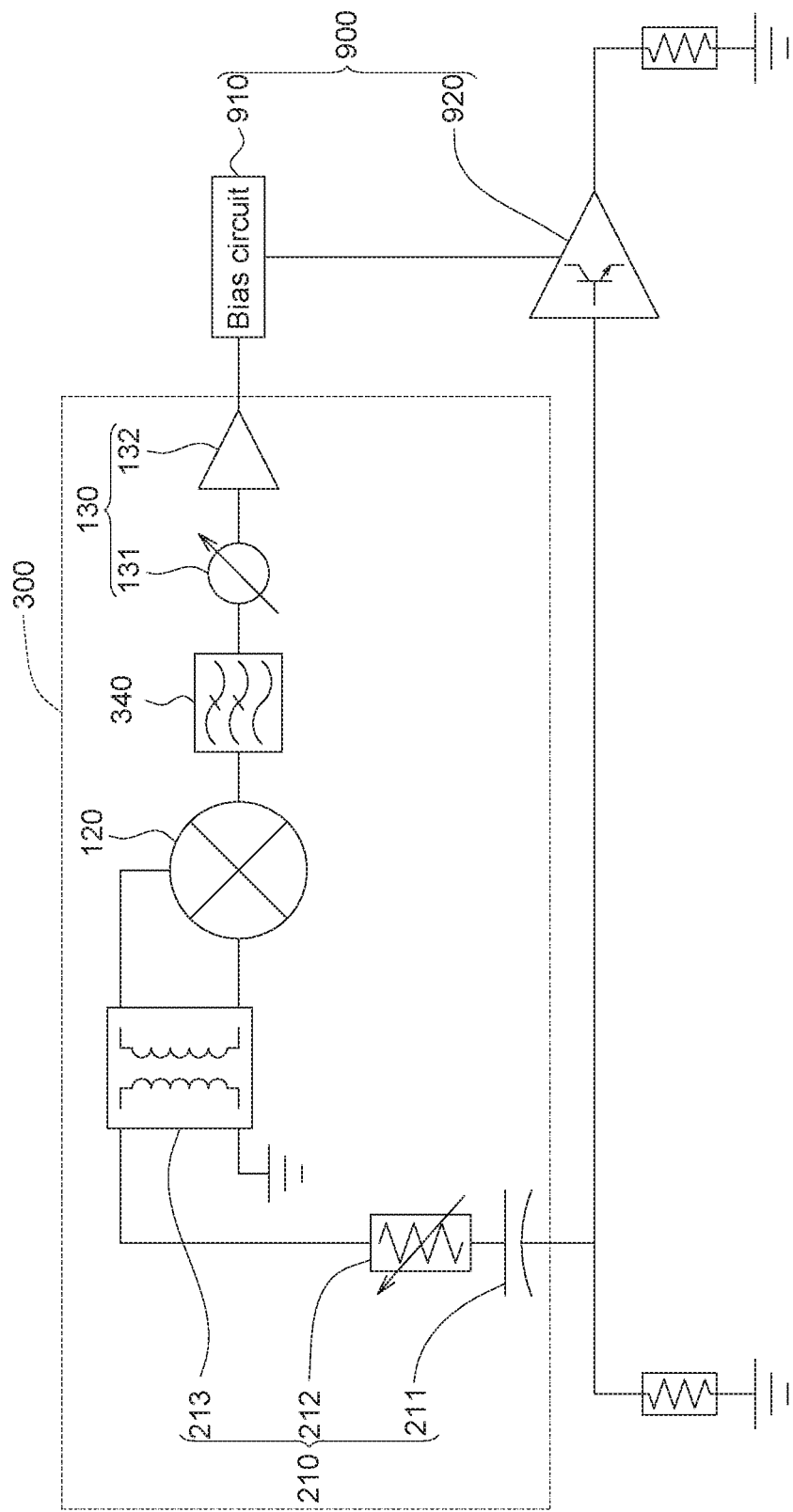
FIG. 10 is a schematic view showing a linearity improving system according to another embodiment.

FIG. 10 is a schematic view showing a linearity improving system 300 according to another embodiment. Referring to FIG. 10, the linearity improving system 300 in this embodiment further includes a low pass filter 340. The low pass filter 340 is coupled to and between the downconverter 120 and the negative group delay circuit 131 of the transformer 130. The low pass filter 340 is used to filter out the high-frequency signal. For example, referring to FIG. 4B, a filter curve LPF represents a filter range, after the signal has passed through the low pass filter 340, only the components of the signal below the frequency $2(\omega_2-\omega_1)$ is preserved. Consequently, the subsequent interactive modulation procedure can be more efficient, and cannot be interfered by the excessive high-frequency signals.

Figure 11:
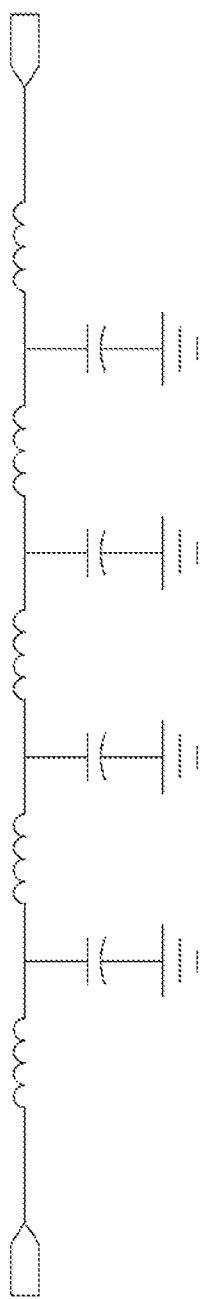
FIG. 11 is a schematic view showing a low pass filter according to an embodiment.

In detail, please refer to FIG. 11, which is a schematic view showing the low pass filter 340 according to an embodiment. The low pass filter 340 consists of several inductors and capacitors, for example. Through the appropriate circuit design, the low pass filter 340 can filter out a high-frequency signal higher than a certain reference frequency.

A modulation signal injection mechanism is provided through the linearity improving systems 100, 200 and 300, and the signal control method of the above-mentioned various embodiments. The modulation signal injection mechanism couples the input RF signal RF_IN to the linearity improving systems 100, 200 and 300, and inputs the modulation signal RF_M generated by the linearity improving systems 100, 200 and 300 back to the bias circuit 910 of the amplifier 900, thereby generating signals with the same amplitude and opposite phases, and generating mixed waves together with the original signal. Consequently, the third-order modulation term or the leaky wave power of the neighboring channel can be effectively suppressed, and the linearity of the amplifier 900 can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A linearity improving system, comprising:
    a coupler configured to couple a part of an input RF signal, wherein the coupler comprises:
        an electrolyte capacitor receiving the input RF signal;
        a tunable attenuator coupled to the electrolyte capacitor; and
        a balun coupled to the tunable attenuator;
    a downconverter, which is coupled to the coupler, converts the input RF signal to a fundamental frequency; and
    a transformer, which is coupled to the downconverter and adjusts a phase and a power of a modulation signal, wherein after the input RF signal and the modulation signal being adjusted are inputted to an amplifier, and the amplifier outputs an output RF signal.

2. The linearity improving system according to claim 1, wherein the coupler provides a 0-degree phase signal and a 180-degree phase signal.

3. The linearity improving system according to claim 1, wherein the transformer comprises:
    a negative group delay (NGD) circuit adjusting the phase of the modulation signal; and
    a baseband amplifier coupled to the negative group delay circuit for adjusting the power of the modulation signal.

4. The linearity improving system according to claim 3, wherein the negative group delay circuit is coupled to the downconverter, and the baseband amplifier is coupled to the negative group delay circuit.

5. The linearity improving system according to claim 3, wherein the baseband amplifier is coupled to the downconverter, and the negative group delay circuit is coupled to the baseband amplifier.

6. The linearity improving system according to claim 1, further comprising:
    a low pass filter coupled to and between the downconverter and the transformer.

* * * * *